US006693332B2

(12) United States Patent
Narendra et al.

(10) Patent No.: US 6,693,332 B2
(45) Date of Patent: Feb. 17, 2004

(54) CURRENT REFERENCE APPARATUS

(75) Inventors: Siva G. Narendra, Portland, OR (US); Stephen H. Tang, Beaverton, OR (US); Zachary Keer, Hillsboro, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/025,047

(22) Filed: Dec. 19, 2001

(65) Prior Publication Data

US 2003/0111698 A1 Jun. 19, 2003

(51) Int. Cl.[7] ........ H01L 29/76
(52) U.S. Cl. ........ 257/401; 257/426; 257/798
(58) Field of Search ........ 257/401, 798, 257/426; 323/315, 317, 312

(56) References Cited

U.S. PATENT DOCUMENTS

| | | | | | |
|---|---|---|---|---|---|
| 5,929,697 | A | * | 7/1999 | Chang | 327/543 |
| 6,346,803 | B1 | * | 2/2002 | Grossnickle et al. | 323/315 |
| 6,445,170 | B1 | * | 9/2002 | Pangal et al. | 323/315 |

OTHER PUBLICATIONS

Lee, Cheol–Hee, et al., "A Temperature and Supply Insensitive CMOS Current", *EEE ICVC*, Available at http://asic.postech.ac.kr/2.Research/2.Publications/iconfer/08.pdf, (Oct. 1997), 498–500.

Lee, Seung–Hoon, "A Temperature and Supply–Voltage Insensitive CMOS Current Reference", *IEICE Trans. Electron, vol. E82–C*, (Aug. 1999), pp. 1562–1566.

Lee, C.–H., et al., "All–CMOS Temperature Independent Current Reference", *Electronics Letters*, vol. 32, No. 14, pp. 1280–1281, (Jul. 4, 1996).

Narendra, S., et al., "Sub–1 V Process–Compensated MOS Current Generation Without Voltage Reference", *IEEE Symposium on VLSI Circuits Digest of Technology Papers*, pp. 143–144, (2001).

* cited by examiner

*Primary Examiner*—Michael S. Lebentritt
*Assistant Examiner*—Douglas Menz
(74) *Attorney, Agent, or Firm*—Schwegman, Lundberg, Woessner & Kluth, P.A.

(57) ABSTRACT

A current reference, which may be fabricated on a die, as part of an integrated circuit, or in various other forms, is disclosed. The current reference includes two current sources, both of which provide a substantially temperature stable output current, which may use a differencing circuit to provide a reference output current having a magnitude approximately equal to the difference between the magnitudes of the two substantially temperature stable output currents.

15 Claims, 5 Drawing Sheets

CURRENT REFERENCE APPARATUS

FIELD OF THE INVENTION

The present invention relates generally to current sources. More particularly, the present invention relates to current references that provide a substantially constant source of current.

BACKGROUND INFORMATION

Current references are circuits designed to provide a source of substantially constant current, typically used in turn by other circuits which depend upon a minimal variance in the supply of current. In fact, the ultimate performance of a circuit which makes use of a current reference is often dependent on the stability of the reference.

One problem with current reference circuits is that the current provided may be sensitive to voltage, temperature, and process variations. Thus, as supply or bias voltage, temperature, or process parameters (such as transistor threshold voltages) vary, the current generated by the reference may also vary. Thus, sensitivity to temperature and power supply voltage variations in current references, and the reduction thereof, has been the subject of much study. See, for example, Sueng-Hoon Lee and Yong Jee, "A Temperature and Supply Voltage Insensitive CMOS Current Reference," IEICE Trans. Electron., Vol. E82-C, No.8, August 1999; and Cheol-Hee et al., "A Temperature and Supply Insensitive CMOS Current Reference Using a Square Root Circuit," IEEE ICVC, October 1997, pp 498–500.

Sensitivity to process variations has been handled historically by using appropriate design margins. For example, if the current generated by the reference changes by a factor of two over the range of expected variations in a process, the current reference manufactured using that process is typically designed to provide a nominal current equal to twice the minimum specified value, so that under worst case conditions the minimum current value is guaranteed to exist. However, power provided to the reference is usually wasted as a result, in part because the nominal current value may be twice what is actually needed.

Another limitation encountered when using a current reference is that an off-chip, precision resistor is typically required to generate the reference current. The off-chip resistor adds to the cost of each design which makes use of such a reference, and also requires physical real estate which might otherwise be available for additional circuit components and features.

Finally, standard off-chip current references require routing current to all locations where it is needed. If such routing is not desirable, multiple references must be used, further increasing cost and real estate requirements.

For these reasons, and others which will become apparent to those skilled in the art upon reading and understanding the instant specification, there is a need in the art for a current reference with reduced sensitivity to voltage, temperature, and process variations. Such a reference should also eliminate the need for an off-chip resistor as part of its operational circuitry.

DESCRIPTION OF THE PREFERRED EMBODIMENTS

Figure 1:
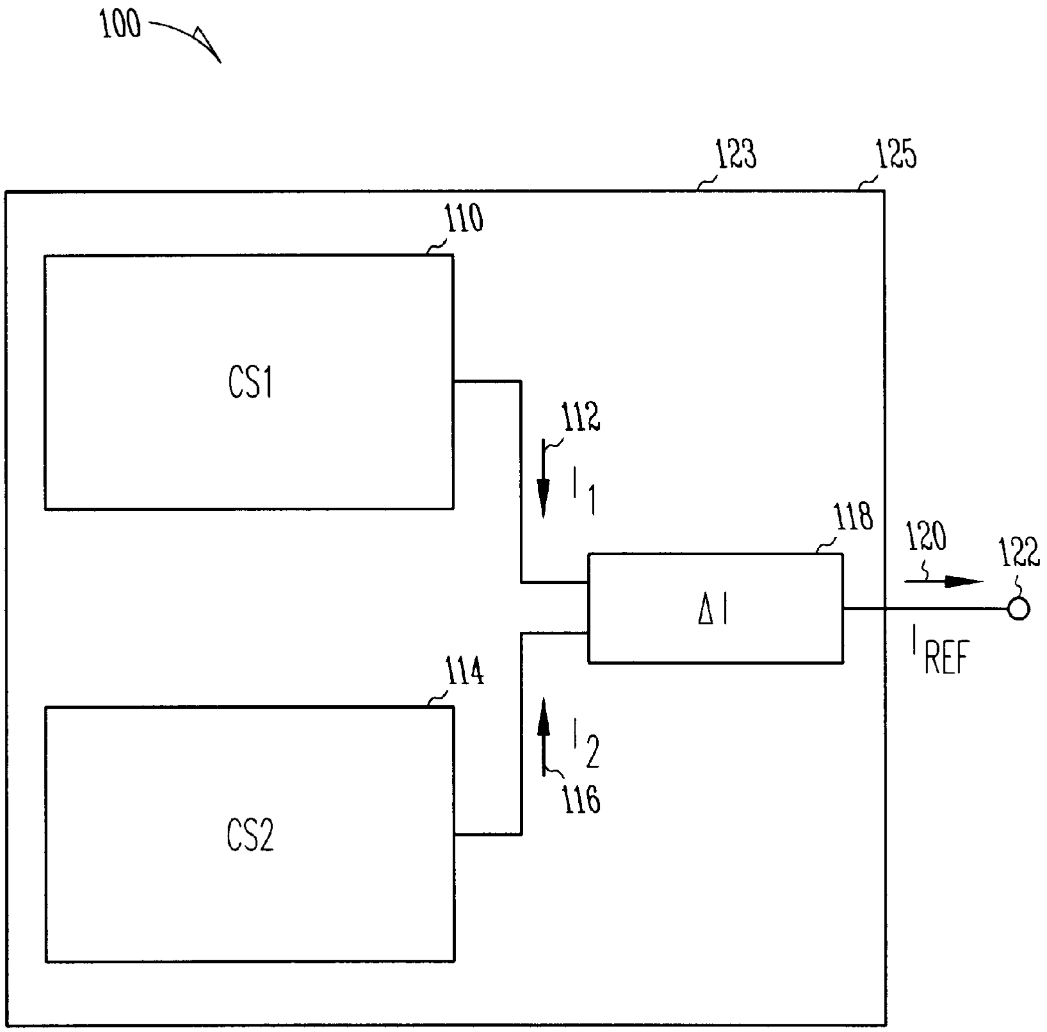
FIG. 1 is a block diagram of a current reference according to the present invention.

In the following detailed description of the invention, reference is made to the accompanying drawings which form a part hereof, and in which are shown by way of illustration, and not of limitation, specific embodiments in which the invention may be practiced. In the drawings, like numerals describe substantially similar components throughout the several views. The embodiments illustrated are described in sufficient detail to enable those skilled in the art to practice the invention. Other embodiments may be utilized and derived therefrom, such that structural, logical, and electrical circuit substitutions and changes may be made without departing from the scope of the invention. The following detailed description, therefore, is not to be taken in a limiting sense, and the scope of the invention is defined only by the appended claims, along with the full range of equivalents to which such claims are entitled.

FIG. 1 is a schematic block diagram of an embodiment of a current reference, a die, and an integrated circuit according to the present invention. The current reference 100 includes a first current source 110 providing an output current 112 (of magnitude $I_1$) which is substantially stable over the expected operating range of temperatures for the reference 100. A second current source 114 is also included in the reference 100. Like the first current source 110, the second current source also provides an output current 116 (of magnitude $I_2$) which is substantially stable over the expected operating temperature range for the reference 100.

Finally, the current reference 100 may include a differencing circuit 118, which provides a reference output current 120 (of magnitude $I_{ref}$) approximately equal to the difference between $I_2$ and $I_1$. The magnitude of $I_1$ may be multiplied by a preselected constant value, k, which may be any real number value selected by the reference designer (except 0, and including 1). That is, the reference output current magnitude $I_{ref}$ may be selected to be approximately equal to the difference $I_2 - k*I_1$, where $k \neq 0$.

The first current source 110 may be similar to, or identical to the second current source 114, with a single exception: the magnitude $I_1$ of the of the output current 112 should not be identical to the magnitude $I_2$ of the output current 116, so that the magnitude $I_{ref}$ of the reference output current 120 will be a non-zero value. This reference output current 120 may be carried by an output node or pin 122, which may be coupled to the current sources 110, 114 and/or the differencing circuit 118. Thus, the reference designer will typically specify that the nominal magnitude $I_2$ of the output current 116 be shifted away from the nominal magnitude $I_1$ of the of the output current 112 by some predetermined amount, so as to increase the probability that a non-zero reference current output $I_{ref}$ will be present at the output node or pin 122 of the die 123 or integrated circuit 125 containing the reference 100, over the expected voltage, process, and temperature variations.

Figure 2:
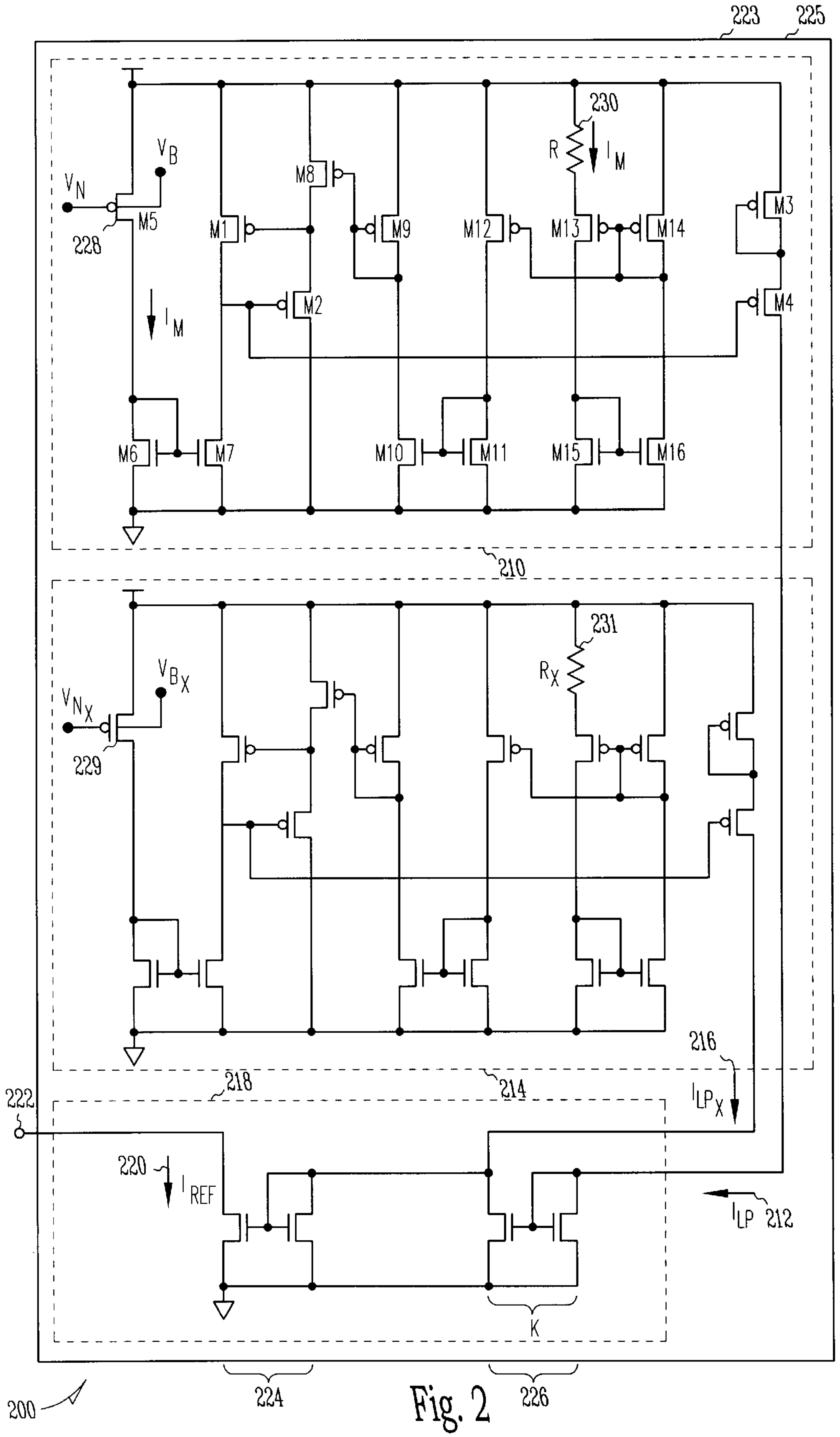
FIG. 2 is a schematic diagram of a current reference according to the present invention.

FIG. 2 is a schematic diagram of a possible embodiment of a current reference, die, and integrated circuit according to the present invention. The approach taken in this case may be characterized as generating a temperature and process compensated reference current by taking the difference between two temperature stable current sources, the output of one source being shifted away from the other, to ensure a non-zero output current. Further process independence is obtained by applying a body bias voltage to selected semiconductor devices within the sources, and scaling the reference output.

The reference 200 in this case may include a first Lee current source as the first current source 210, providing an output current 212 of magnitude $I_{LP}$. A second Lee current source may be used as the second current source 214, with an output magnitude of $I_{LPx}$. As used herein, the term "Lee current reference" means any current reference which is identical to, or similar to, the circuit structure shown with respect to element 210 in FIG. 2, or any other structure which operates to provide a substantially temperature stable output current by canceling the mobility dependence of the output current using a first internal current component (which is proportional to mobility), multiplied by a second internal current component (which is inversely proportional to mobility) using a square-root circuit, as is well known to those skilled in the art. Reference may also be made to the article published by Messrs. Sueng-Hoon Lee and Yong Jee, noted above, as well as the article by C.-H. Lee and H.-J Park, "All-CMOS Temperature Independent Current Reference", Electronics Letters, Vol. 32, No. 14, Jul. 4, 1996. For example, in FIG. 2, the Lee current reference 210 uses transistors M1–M4 (typically operating in the subthreshold region) to implement the square-root multiplication circuit. Transistors M5–M16 are typically operated in the strong inversion saturation region, such that M5–M7 generate the current component proportional to mobility ($I_M$), and M8–M16 to generate the current component which is inversely proportional to mobility ($I_M$). The term "substantially temperature stable" with respect to an output current, as used herein, means an output current which has a magnitude that varies by less than about ±5% over a temperature range of about 0 to 110° C.

Subtracting the output currents 212, 216 from each other, as generated by a pair of similarly constructed, substantially temperature stable current sources, such as the Lee references 210, 214, using the differencing circuit 218, results in an output current 220 which is substantially constant with respect to process variations (as long as the current sources 210, 214 are both made using the same or similar processes). In this case, the differencing circuit 218 is constructed using a pair of electronically coupled current mirrors 224, 226. One of the current mirrors 226 is designed to implement the scaling constant, k, which is typically chosen after test data are obtained, such that the lowest value of current variation is obtained. k is determined by the ratio of the transistor sizes in the current mirror 226.

The references 210, 214, as well as the differencing circuit 218, may be constructed on a single die 223, or as part of an integrated circuit 225. The output node 222 of the integrated circuit 225 is in electrical communication with the references 210, 214 and the differencing circuit 218, such that the output current 220 is carried by the output node 222, external to the reference 200.

The value of resistance R, $R_x$ in the references 210, 214 is selected to ensure that the output current magnitudes $I_{LP}$ and $I_{LPx}$ are different (i.e., $I_{LPx}$ is shifted away from $I_{LP}$), such that the magnitude of $I_{ref}$ is non-zero over the expected operating range of the circuitry. It should be noted that the resistance values R, $R_x$ may be implemented using a physical resistor, or some equivalent element, such as a metal-oxide semiconductor (MOS) n-well device, which presents an appropriate resistance value within the circuitry of the references 210, 214. To further decrease the dependence of the output current 222 due to variations in process, a body bias voltage $V_b$, $V_{bx}$ may be applied to one or more transistors 228, 229 included in the current sources 210, 214. The equations representing the magnitudes of the first and second output currents, $I_{LP}$ and $I_{LPx}$, as well as the magnitude of the reference output current $I_{ref}$, are as follows:

$$I_{LP}=c_1*[(V_{dd}-V_n-V_t)/R]; \quad [1]$$

$$I_{LPx}=c_2*[(V_{dd}-V_{nx}-V_{tx})/R_x]; \text{ and} \quad [2]$$

$$I_{ref}=I_{LPx}-k*I_{LP}, \quad [3]$$

where $c_1$ and $c_2$ are constants, $V_n$ and $V_{nx}$ are parameters of the Lee references, $V_t$ and $V_{tx}$ are the threshold voltages arising from the application of body bias $V_b$ and $V_{bx}$, respectively, and k is the scaling factor noted previously. It should be noted that the constants $c_1$ and $c_2$ are scaling constants which depend on the relative sizes of the transistors in the circuit; these constants determine the relative magnitude of the currents $I_{LP}$ and $I_{LPx}$. (e.g., whether $I_{LP}$ and $I_{LPx}$ are in the microampere or milliampere range). It should also be noted that $V_n$ and $V_{nx}$ are important to obtaining proper temperature compensation in the Lee references; $V_n$ is used to bias the transistor 228 so that its current mobility dependence cancels the inverse mobility dependence of the current in resistor 230. $V_{nx}$ is used in a similar fashion with respect to transistor 229, to cancel the current dependence in resistor 231.

Since $I_{LP}$ and $I_{LPx}$ depend on $V_{dd}$, the parameters $V_n$ and $V_{nx}$ should be chosen after $V_{dd}$ has been determined. If the percentage change in R, $R_x$ and $V_t$, $V_{tx}$ with respect to temperature is known, then $V_n$, $V_{nx}$ can be calculated such that the temperature dependence of $I_{LP}$, $I_{LPx}$ can be substantially reduced, or even eliminated. $V_t$, $V_{tx}$, and k are chosen based on test data for the fabricated devices, and typically are only changed if the circuitry is manufactured using a different process technology. Otherwise, fixing the values of $V_t$, $V_{tx}$, $V_n$, $V_{nx}$, and k serves to adequately compensate for day-to-day variance in the manufacturing process.

Figure 3:
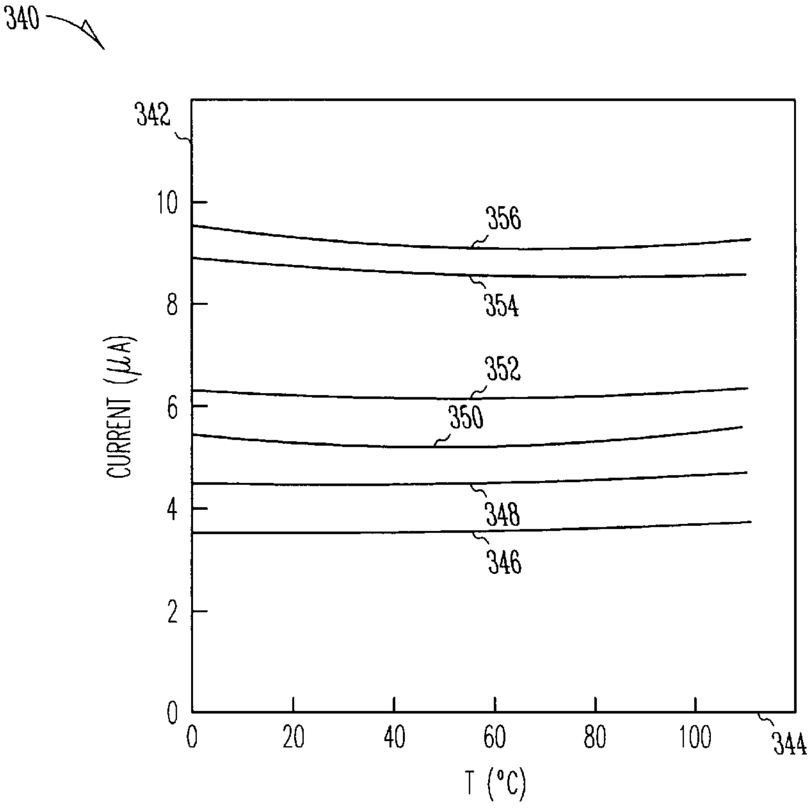
FIG. 3 is a graph of internal currents over a range of temperatures and processes which may be provided by a current reference according to the present invention.

FIG. 3 is a graph of internal currents over a range of temperatures and processes which may be provided by a current reference constructed according to the present invention (e.g., similar to that illustrated in FIG. 2). More particularly, the graph 340 illustrates the expected changes in output current 342 versus temperature 344 for $I_{LP}$ and $I_{LPx}$ as the result of devices manufactured using a slow process 346, 348; a typical process 350, 352; and a fast process 354, 356. As used herein, "slow" and "fast" processes refer to manufacturing processes which vary so as to provides semiconductors that operate differently given a fixed bias voltage. Generally, a "fast" device exhibits a higher source current than a "slow" device, given the same value of applied bias voltage. In this case, the expected variation of each Lee reference across the operating temperature range is about ±1%.

Figure 4:
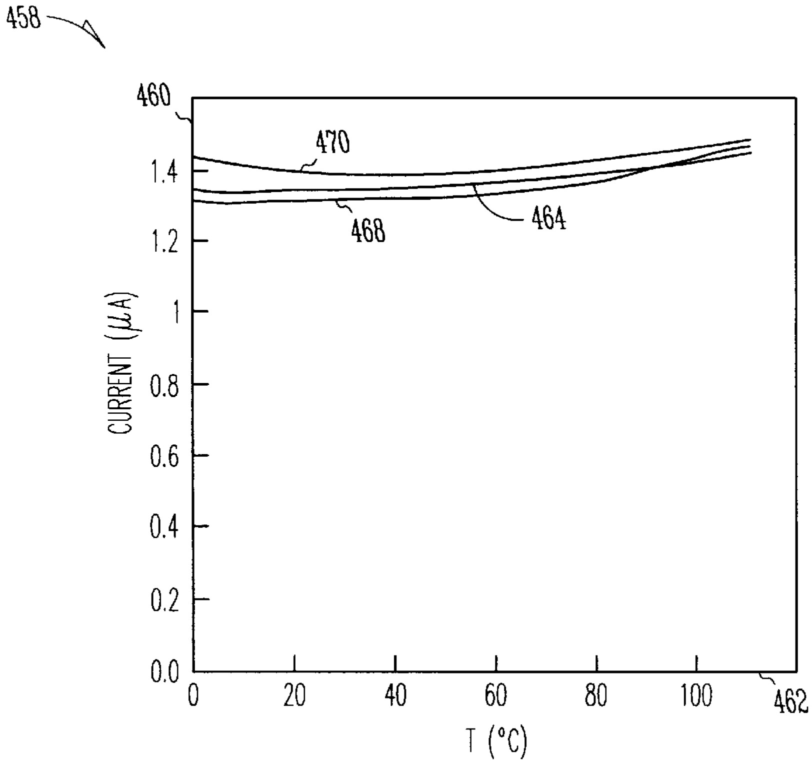
FIG. 4 is a graph of reference current output over a variety of processes which may be provided by a current reference according to the present invention.

FIG. 4 is a graph of reference current output over a variety of processes which may be provided by a current reference constructed according to the present invention (e.g., similar to that illustrated in FIG. 2). More particularly, the graph 458 illustrates the expected changes in reference output current 460 versus temperature 462 as a result of a slow process 464, a typical process 468, and a fast process 470. Referring to graphs 340 and 458, shown in FIGS. 3 and 4 respectively, it can be seen that even though the internal currents $I_{LP}$ and $I_{LPx}$ of the first and second references vary by almost eight microamperes over temperature and process, the reference output current varies by less than about 0.2 microamperes over the same temperature and process variations.

Figure 5:
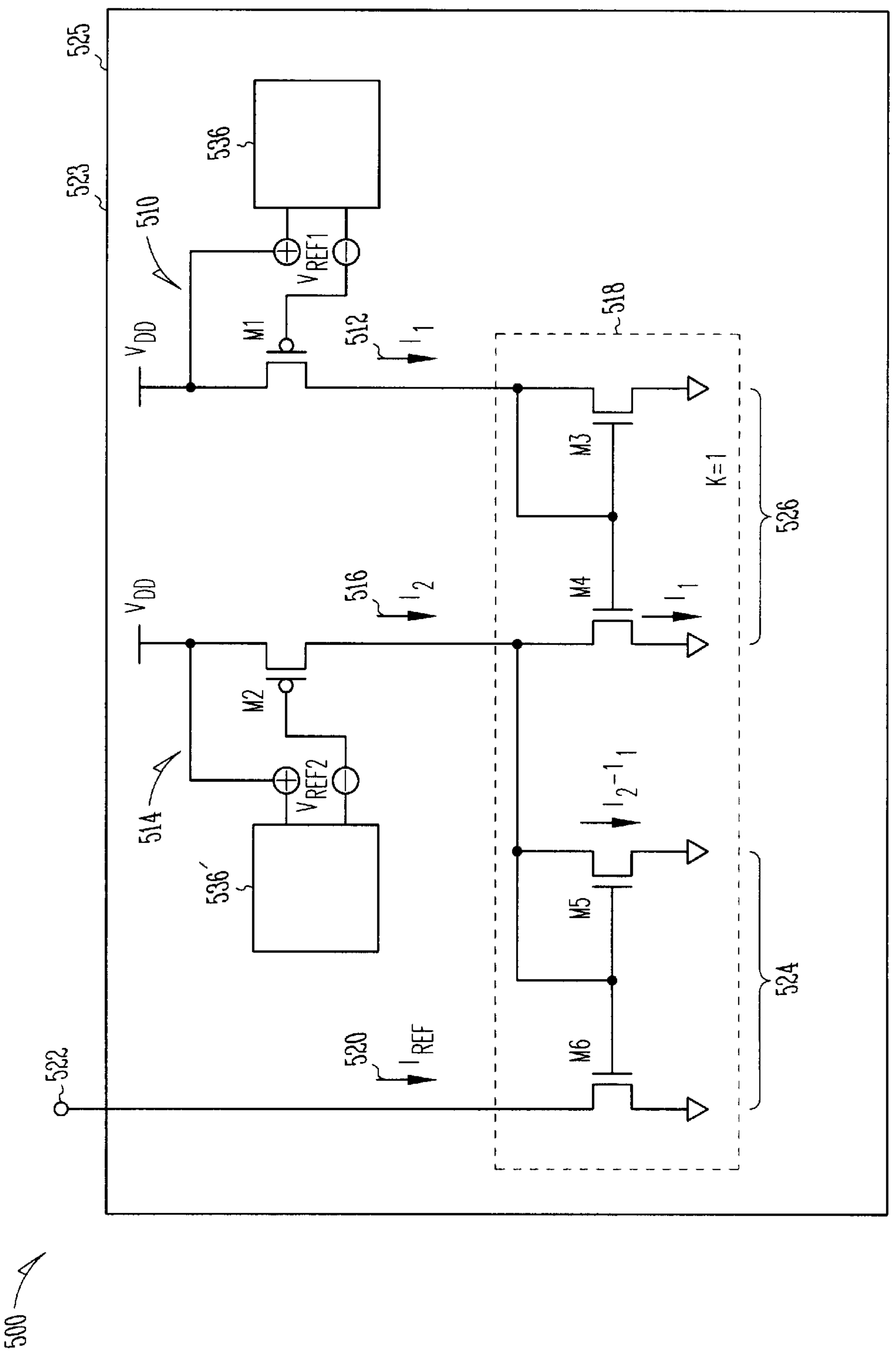
FIG. 5 is a schematic diagram of a current reference according to an alternative embodiment of the present invention.

Another approach to solving the problems which arise in the prior art with respect to current references can be seen in FIG. 5, which is a schematic diagram of another possible embodiment of a current reference according to the present invention. In this case, the general approach to providing a reference current which is compensated for temperature, process, and supply voltage variations uses one or more temperature stable voltage sources operating two semiconductor devices in saturation mode. The difference in output current between each of the semiconductor devices provides a stable reference current.

As shown in FIG. 5, the current reference 500 includes a first current source 510 providing a first substantially temperature stable output current 512 (having a first magnitude $I_1$) and a second current source 514 providing a second substantially temperature stable output current 516 (having a second magnitude $I_2$). A differencing circuit 518 providing a reference output current 520 with a reference magnitude $I_{ref}$ approximately equal to the difference between the second magnitude $I_2$ and a product of the first magnitude $I_1$ and a preselected scaling constant k. As noted above, the differencing circuit 518 may include a pair of current mirrors 524, 526, with one of the current mirrors 526 constructed so that the scaling constant k=1. To ensure that the reference magnitude $I_{ref}$ will be a non-zero value, the second magnitude $I_2$ is typically selected so that it is shifted by a predetermined amount from the first magnitude $I_1$.

The first current source 510 may include a first semiconductor device M1 (e.g., a MOS field effect transistor, or MOSFET) operated in saturation mode and biased by a substantially temperature stable voltage source 536, which may be a band-gap voltage reference, similar to or identical to those commonly used with digital-to-analog converters, as are well known to those skilled in the art. Similarly, the second current source 514 may include a second semiconductor device M2 (e.g., another MOSFET) operated in saturation mode and biased by a substantially temperature stable voltage source 536', which may be similar to, or identical to the voltage source 536. In fact, if desired, a single voltage source 536 may be used to bias both devices M1, M2. As used herein, a "substantially temperature stable voltage source" means a voltage source whose output voltage varies by no more than about ±100 microvolts/° C. It should be noted that the performance of the reference 500 will improve as the output resistance of the semiconductor devices M1, M2 increases.

The current reference 500 may also be characterized as including a voltage source 536 having a substantially temperature stable output voltage (e.g. a single voltage source 536 which takes the place of voltage sources 536, 536', such that $V_{ref1}=V_{ref2}$), and first and second semiconductor devices M1, M2, each biased by the substantially temperature stable output voltage source 536 so as to operate in the saturation mode.

In either case, the differencing circuit 518, which may include a pair of current mirrors, is electronically coupled to the first and second semiconductor devices M1, M2. The differencing circuit and semiconductor devices M1, M2 may be fabricated on a single die 523, or as part of an integrated circuit 525, with the reference output current 520 carried by an output node 522, external to the current reference 500 circuitry. As noted above, a single voltage source 536, or more than one voltage source 536, 536' may be used to bias the semiconductor devices M1, M2, and either one, or both of the voltage sources 536, 536' may be a band-gap voltage source.

If MOSFETs are used to construct the current reference 500, the following design equations may be employed:

$$I_d(P,T)=\mu(T)C_{ox}(P)Z[V_{gs}-V_t(T,P)]^2 \quad [4]$$

$$I_{ref}(P_1, T_1)=I_{ref}(P_2, T_2) \quad [5]$$

$$I_{ref}(P_2, T_1)=I_{ref}(P_1, T_2) \quad [6]$$

$$I_{ref}(P_1, T_2)=I_{ref}(P_2, T_2) \quad [7]$$

where $I_{ref}=I_2-I_1$. Equation [4] illustrates the basic square-law equation for MOSFET saturation current, wherein the process and temperature dependent terms are highlighted, namely, $\mu(T)C_{ox}(P)$ and $V_t(T,P)$. $I_d$ is the drain current through the MOSFET as a function of temperature and process, $\mu(T)$ is the mobility, $C_{ox}$ is the oxide capacitance, Z is the absolute width of the device, $V_{gs}$ is the voltage gate-to-source, and $V_t$ is the threshold voltage. By fitting the square-root of $I_d$ to a straight line, one may solve for $\mu(T)C_{ox}(P)$ as the square of the slope obtained, and for $V_t(T,P)$ as the x-intercept.

By substituting $I_2$ and $I_1$ in place of $I_d$ in equation [4], and setting $I_{ref}$ to be the same at the temperature and process extremes (i.e., at $(P_1, T_1)$, $(P_1, T_2)$, $(P_2, T_1)$, and $(P_2, T_2)$), the equations [5], [6], and [7] can be solved as a set of simultaneous equations. That is, the design variables $Z_{rat}$ (the ratio of the widths of the two devices), $V_{gs1}$ (the gate-to-source voltage of one device), and $V_{gs2}$ (the gate-to-source voltage of the other device) can be determined, once $\mu(T)C_{ox}(P)$ and $V_t(T,P)$ are known.

It should also be noted that solving equations [5], [6], and [7] in this manner assumes that $\mu(T)C_{ox}(P)$ and $V_t(T,P)$ are monotonic functions of process and temperature. For example, equation [5] may be rewritten as:

$$\begin{aligned}
&\mu(T_1)C_{ox}(P_1)Z_{rat}\\
&[V_{gs2}-V_{t2}(T_1, P_1)]^2\\
&-\mu(T_1)C_{ox}(P_1)[V_{gs1}\\
&-V_{t1}(T_1, P_1)]^2\\
&=\mu(T_2)C_{ox}(P_2)Z_{rat}\\
&[V_{gs2}-V_{t2}(T_2, P_2)]^2\\
&-\mu(T_2)C_{ox}(P_2)[V_{gs1}\\
&-V_{t1}(T_2, P_2)]^2
\end{aligned} \quad [8]$$

However, solving all three equations simultaneously is not a very flexible process; it forces exact values for $V_{gs1}$, $V_{gs2}$, and $Z_{rat}$, and renders adjustments for actual circuit element performance difficult. In practice, it is better to choose one parameter as a matter of convenience, leaving the other two parameters to be solved. For example, one may choose $Z_{rat}$ to be the ratio of the transistor sizes M1/M2, or M3/M4 (i.e., the k factor).

Figure 6:
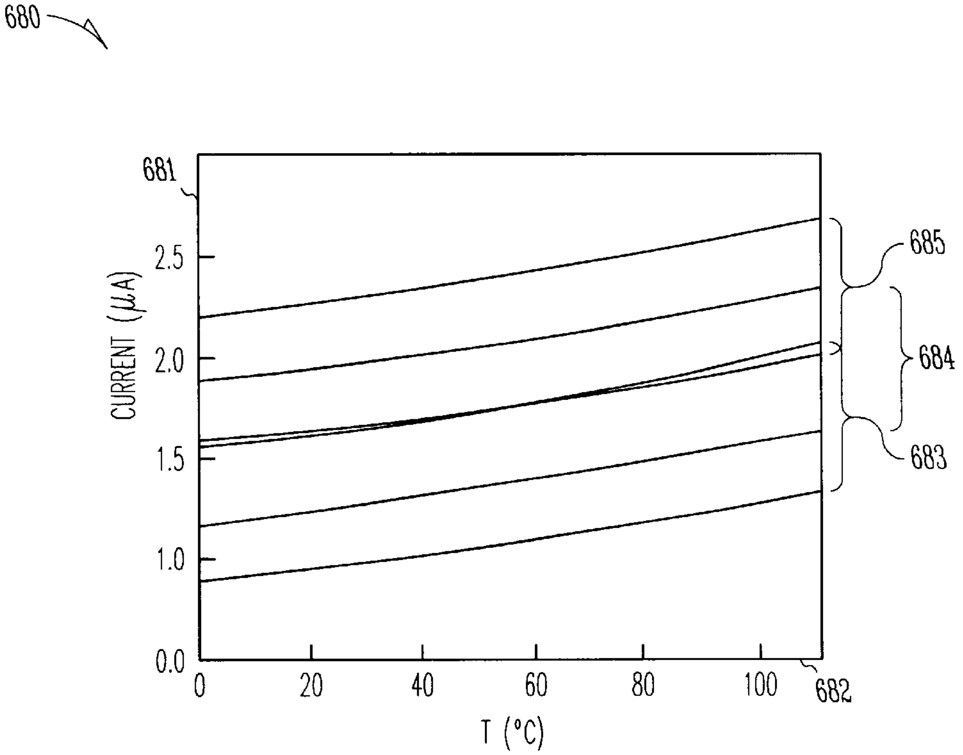
FIG. 6 is a graph of internal currents over a range of temperatures and processes which may be provided by a current reference according to an alternative embodiment of the present invention.

FIG. 6 is a graph of the expected internal currents over a range of temperatures and processes which may be provided by a current reference constructed according to the alternative embodiment of the present invention shown in FIG. 5. More particularly, the graph 680 illustrates the expected changes in output current 681 versus temperature 682 for $I_1$ and $I_2$ as the result of devices manufactured using a slow process 683; a typical process 684; and a fast process 685. In this case, the expected variation of the output currents $I_1$ and $I_2$ of the semiconductor devices M1, M2 across the operating temperature range is less than about three micro-Amperes.

Figure 7:
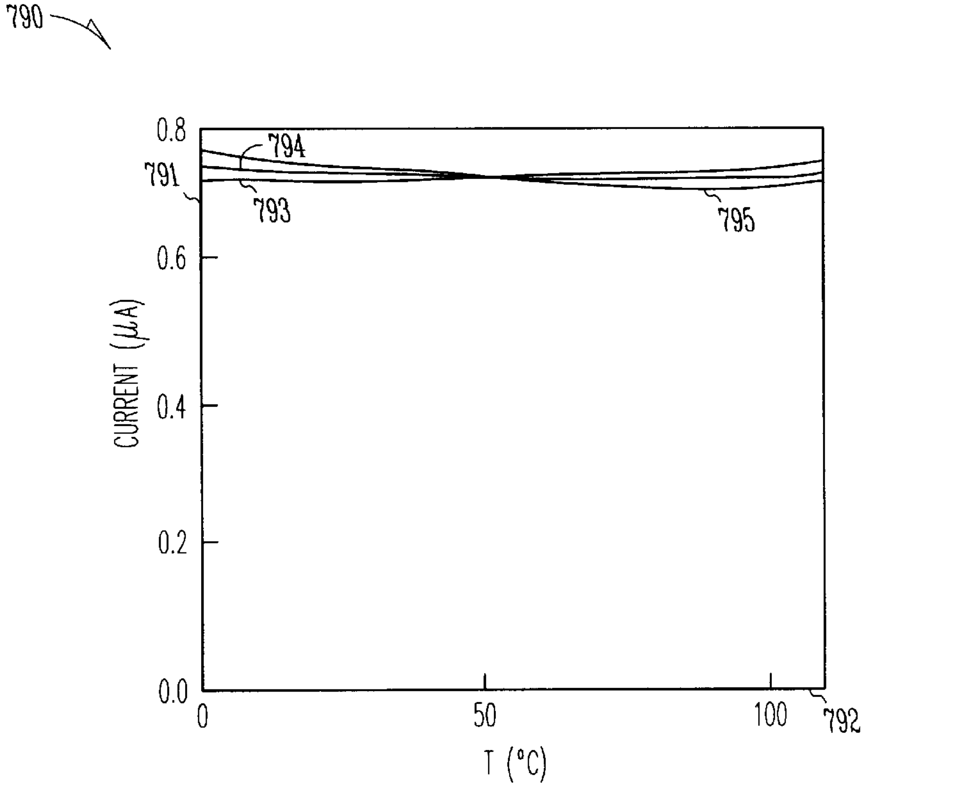
FIG. 7 is a graph of reference current output over a variety of processes and temperatures which may be provided by a current reference according to an alternative embodiment of the present invention.

FIG. 7 is a graph of the expected reference current output over a variety of processes as might be provided by a current reference constructed according to an alternative embodiment of the present invention, such as that shown in FIG. 5. More particularly, the graph 790 illustrates the expected changes in reference output current 791 versus temperature 792 for $I_{ref}$ as a result of a slow process 793, a typical process 794, and a fast process 795. Referring to graphs 680 and 790, shown in FIGS. 6 and 7 respectively, it can be seen that even though the internal currents $I_1$ and $I_2$ of the first and second semiconductor devices M1, M2 vary by almost three microamperes over temperature and process, the reference output current $I_{ref}$ varies by less than about 0.04 microAmperes over the same temperature and process variations. Thus, even though the individual device currents may vary by about ±30% when $\mu(T)C_{ox}(P)$ and $V_t(T,P)$ change over temperature and pressure, the compensation technique applied using the embodiment of the invention shown in FIG. 5 is expected to reduce the variation of $I_{ref}$ to less than about ±2%. Of course, the values of $V_{gs1}$, $V_{gs2}$, and $Z_{rat}$ can be further refined when actual circuitry, and its true non-ideal characteristics, are realized.

One of ordinary skill in the art will understand that the apparatus of the present invention can be used in other applications, and thus, the invention is not to be so limited. The illustrations of a reference 100, 200, 500, a die 123, 223, 523, and an integrated circuit 125, 225, 525 are intended to provide a general understanding of the structure of the present invention, and are not intended to serve as a complete description of all the elements and features of current references, dies, integrated circuits, and other devices which might make use of the structures described herein.

Applications which may include the novel current reference, dies, and integrated circuits of the present invention include electronic circuitry used in high-speed computers, communications equipment, modems, processor modules, embedded processors, and application-specific modules, including multilayer, multi-chip modules. Such references, dies, and integrated circuits may further be included as sub-components within a variety of electronic systems, such as televisions, cellular telephones, personal computers, personal radios, automobiles, aircraft, and others.

The current reference which embodies the present invention provides a temperature and process compensated source of current for use in a wide variety of applications. Designers are now free to use current references in area-critical circuits, without specifying the characteristics of, or reserving precious circuit board real estate for an additional component in the form of an external resistor.

Although specific embodiments have been illustrated and described herein, those of ordinary skill in the art will appreciate that any arrangement which is calculated to achieve the same purpose may be substituted for the specific embodiments shown. P-channel FETs, N-channel FETs, bipolar transistors, and their equivalents may be substituted in place of the semiconductor devices shown in the schematics described above, given appropriate changes in bias circuits, voltages, and currents, well known to those skilled in the art. Similarly, such devices may be used in place of resistors, capacitors, and other circuit elements illustrated herein. As such, this disclosure is intended to cover any and all adaptations or variations of the present invention. It is to be understood that the above description has been made in an illustrative fashion, and not a restrictive one. Combinations of the above embodiments, and other embodiments not specifically described herein will be apparent to those of skill in the art upon reviewing the above description. The scope of the invention includes any other applications in which the current references described herein may be used. The scope of the invention should be determined with reference to the appended claims, along with the full range of equivalents to which such claims are entitled.

What is claimed is:

1. A current reference, comprising:

a first current source to provide a first substantially temperature stable output current having a first magnitude;

a second current source to provide a second substantially temperature stable output current having a second magnitude shifted by a predetermined amount from the magnitude of the first substantially temperature stable output current; and a differencing circuit to provide a reference output current having a reference magnitude approximately equal to the difference between the second magnitude and a product of the first magnitude and a preselected scaling constant.

2. The current reference of claim 1, wherein the first current source is a first Lee current source.

3. The current reference of claim 2, wherein a first selected body bias voltage is applied to a first transistor included in the Lee current source.

4. The current reference of claim 3, wherein the second current source is a second Lee current source.

5. The current reference of claim 4, wherein a second selected body bias voltage is applied to a second transistor included in the second Lee current source.

6. The current reference of claim 5, wherein a value of resistance in the second Lee current source is selected to determine the amount that the second magnitude is shifted from the first magnitude.

7. The current reference of claim 1, wherein the differencing circuit includes a first current mirror selected to determine the scaling constant.

8. The current reference of claim 7, wherein the differencing circuit includes a second current mirror electronically coupled to the first current mirror.

9. The current reference of claim 1, wherein the first current source includes a first semiconductor device operated in saturation mode and biased by a substantially temperature stable voltage.

10. The current reference of claim 9, wherein the differencing circuit includes a first current mirror selected to determine the scaling constant.

11. The current reference of claim 1, wherein the first current source consists of a first semiconductor device operated in saturation mode and biased by a substantially temperature stable voltage.

12. An integrated circuit, comprising:

a first current source to provide a first substantially temperature stable output current having a first magnitude;

a second current source to provide a second substantially temperature stable output current having a second magnitude shifted by a predetermined amount from the magnitude of the first substantially temperature stable output current;

a differencing circuit to provide a reference output current having a reference magnitude approximately equal to the difference between the second magnitude and a product of the first magnitude and a preselected scaling constant; and an output node in electrical communication with the differencing circuit and to carry the reference output current.

13. The integrated circuit of claim 12, wherein the first and second current sources are Lee current sources.

14. The integrated circuit of claim 12, wherein the differencing circuit includes a first current mirror selected to determine the scaling constant.

15. The integrated circuit of claim 12, wherein the first current source includes a first semiconductor device operated in saturation mode and biased by a substantially temperature stable voltage.

* * * * *